(12) United States Patent
Kellermann et al.

(10) Patent No.: US 9,263,696 B2
(45) Date of Patent: Feb. 16, 2016

(54) ORGANIC SEMICONDUCTOR COMPONENT COMPRISING A DOPED HOLE CONDUCTOR LAYER

(75) Inventors: Renate Kellermann, Erlangen (DE); Anna Maltenberger, Leutenbach (DE); Günter Schmid, Hemhofen (DE); Jan Hauke Wemken, Nürnberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 90 days.

(21) Appl. No.: 13/982,053

(22) PCT Filed: Jan. 5, 2012

(86) PCT No.: PCT/EP2012/050117
§ 371 (c)(1),
(2), (4) Date: Jul. 26, 2013

(87) PCT Pub. No.: WO2012/100972
PCT Pub. Date: Aug. 2, 2012

(65) Prior Publication Data
US 2014/0034934 A1    Feb. 6, 2014

(30) Foreign Application Priority Data

Jan. 26, 2011  (DE) .......................... 10 2011 003 192

(51) Int. Cl.
*H01L 51/50* (2006.01)
*H01L 51/56* (2006.01)
*H01L 51/00* (2006.01)

(52) U.S. Cl.
CPC .......... *H01L 51/5064* (2013.01); *H01L 51/002* (2013.01); *H01L 51/0051* (2013.01);

(Continued)

(58) Field of Classification Search
CPC .................................................. H01L 51/5064
See application file for complete search history.

(56) References Cited

U.S. PATENT DOCUMENTS 5,853,906 A    12/1998  Hsieh
7,659,010 B2    2/2010  Burn et al.
(Continued)

FOREIGN PATENT DOCUMENTS

CN    1791655    6/2006
CN    101076902    11/2007
(Continued)

OTHER PUBLICATIONS

Neil G. Connelly et al., "Chemical Redox Agents for Organometallic Chemistry," Chemical Reviews, American Chemical Society (ACS), vol. 96, No. 2, 1996, pp. 877-910.
(Continued)

*Primary Examiner* — Lex Malsawma
(74) *Attorney, Agent, or Firm* — Staas & Halsey LLP

(57) ABSTRACT

An organic semiconductor component with a hole conductor layer having p-type doping with a superacid salt has greatly improved charged transport and optical properties. Besides increasing the specific conductivity at very low doping concentrations, the doping brings about substantially no negative change in the color impression of the layer for the human eye. The absorbtivity of the hole conductor layer is not increased in the visible wavelength range as a result of the p-type doping with the superacid salt. Deposition from solution and from the gas phase is possible.

15 Claims, 12 Drawing Sheets

(52) U.S. Cl.
CPC ............ *H01L51/5052* (2013.01); *H01L 51/56* (2013.01); *H01L 51/0003* (2013.01); *H01L 51/006* (2013.01); *H01L 51/0008* (2013.01); *H01L 51/5088* (2013.01); *H01L 51/5096* (2013.01)

(56) References Cited

U.S. PATENT DOCUMENTS

| | | | |
|---|---|---|---|
| 7,851,072 | B2 | 12/2010 | Kwong et al. |
| 8,216,699 | B2 | 7/2012 | Burn et al. |
| 8,513,702 | B2 | 8/2013 | Schmid et al. |
| 8,603,645 | B2 | 12/2013 | Kwong et al. |
| 2005/0224765 | A1 | 10/2005 | Hsu et al. |
| 2007/0003789 | A1 | 1/2007 | Kwong et al. |
| 2007/0009759 | A1 | 1/2007 | Burn et al. |
| 2007/0069185 | A1 | 3/2007 | Hsu et al. |
| 2009/0211640 | A1* | 8/2009 | Lee et al. ............ 136/263 |
| 2010/0096983 | A1 | 4/2010 | Burn et al. |
| 2010/0109000 | A1* | 5/2010 | Mathai et al. ......... 257/40 |
| 2010/0308306 | A1 | 12/2010 | Schmid et al. |
| 2011/0060143 | A1 | 3/2011 | Kwong et al. |

FOREIGN PATENT DOCUMENTS

| | | |
|---|---|---|
| DE | 102011003192 | 1/2011 |
| DE | 102010056519 | 6/2012 |
| EP | 0948063 | 10/1999 |
| EP | 1615971 | 6/2009 |
| JP | 2003-272865 | 9/2003 |
| JP | 2003-297582 | 10/2003 |
| JP | 2007-531807 | 11/2007 |
| JP | 2008-202053 | 9/2008 |
| JP | 2009-206522 | 9/2009 |
| JP | 2010-530618 | 9/2010 |
| JP | 2010-265236 | 11/2010 |
| JP | 2012-507151 | 3/2012 |
| WO | 03/065770 A1 | 8/2003 |
| WO | 2008/057615 | 5/2008 |
| WO | 2011/063083 | 5/2011 |
| WO | PCT/EP2012/050117 | 1/2012 |

OTHER PUBLICATIONS

German Office Action for German Priority Patent Application No. 10 2011 003 192.8, issued Apr. 5, 2013, 5 pages.
German Office Action for German Priority Patent Application No. 10 2011 003 192.8, issued Aug. 1, 2011, 5 pages.
English language copy of International Search Report for PCT/EP2012/050117, mailed Feb. 9, 2012, 3 pages.
Chinese Office Action issued Apr. 3, 2015 in corresponding Chinese Patent Application No. 201280006603.1.
Japanese Office Action for related Japanese Patent Application No. 2013-550813, mailed Nov. 4, 2014, 7 pages.
Japanese Notice of Allowance dated Dec. 1, 2015 from Japanese Patent Application No. 2013-550813, 4 pages.
Chinese Office Action dated Nov. 23, 2015 from Chinese Patent Application No. 201280006603.1, 20 pages.

* cited by examiner

ORGANIC SEMICONDUCTOR COMPONENT COMPRISING A DOPED HOLE CONDUCTOR LAYER

CROSS REFERENCE TO RELATED APPLICATIONS

This application is based on and hereby claims priority to International Application No. PCT/EP2012/050117 filed on Jan. 5, 2012 and German Application No. 10 2011 003 192.8 filed on Jan. 26, 2011, the contents of which are hereby incorporated by reference.

BACKGROUND

The present invention relates to organic semiconductor components and to the production thereof.

In the field of organic semiconductors, it is known that electron transport layers have to be used for transport of electrons as charge carriers, and hole transport layers for transport of holes as charge carriers.

An organic light-emitting diode is just one example from the related art in which doping is used to increase the conductivity of charge transport layers and charge generation layers. In organic field-effect transistors, solar cells or photodetectors too, the problem of doping arises, for example for injection layers to reduce the contact resistance, for example at source and drain electrodes, or electrodes in general.

An example of a procedure known in principle for the doping of organic materials is to introduce dopant molecules or dopant ions into a matrix of an organic substance. For the p-doping of hole conductor layers, electron acceptors are introduced. Known examples of such electron acceptors suitable for p-doping are metal complexes. The already known dopants used usually have disadvantages either in the processing or else in the effect thereof on properties of the semiconductor component outside the area of increased conductivity. Such areas are, for example efficiency and lifetime. In most organic semiconductor components, efficiency and lifetime depend strongly on the charge carrier density at various interfaces. Especially in organic light-emitting diodes, the exciton density in the light-emitting layer determines the light yield and efficiency of the component.

With regard to the processing of the dopants for production of the component, the problem frequently exists in the related art that the dopants are restricted to one deposition method and accordingly can be processed exclusively from the gas phase or exclusively from the liquid phase. Accordingly, these dopant classes are also each restricted to one material class for the semiconductor matrix. In other words, a dopant which can be deposited only from the liquid phase can only be introduced into a polymer matrix. A dopant which can be deposited exclusively from the gas phase can only be introduced into a small molecule matrix. In the case of suitability for deposition from the gas phase, an additional factor is that the dopant has to be heatable to a certain temperature without decomposing. Only when the dopant is suitable for forming a doped hole conductor layer together with the matrix material in a condensation reaction is it an option for use in component production.

As well as these additional demands on dopants, the primary aim is to further improve the doping action thereof and thus to further increase the conductivity of organic semiconductor layers.

SUMMARY

One possible object is to specify a component having a hole conduction layer with improved doping. It is a further potential object to specify a production process for such a component.

The device proposed by the inventors is a semiconductor component with at least one organic hole conductor layer. This hole conductor layer has p-doping with a superacid salt. Superacid salts in the context of this document refer to superacids, but also very strong acids. These may be mineral or organic.

The substance class of the superacid salts is surprisingly found to be a very good p-dopant in hole conductor layers. The advantage of the proposed device is a significant increase in conductivity of the hole conductor layer through introduction of the doping at very low concentrations of the dopant.

The semiconductor component especially has p-doping with a superacid salt, the superacid being an acid having an acid constant value pKa of <0. Particular preference is given to superacids having an acid constant value pKa<−4. Such superacid salts have the advantage that the acid anions thereof are very weakly coordinating and hence only weakly bound in metal complexes. If metal atoms are then coordinatively unsaturated in these complexes, the free coordination sites can be occupied by hole conductor molecules of the matrix material. Only in the case of very weak binding of the acid anions to the metal atoms is it possible that the hole conductor molecules of the hole conductor matrix displace these acid anions.

In an advantageous configuration, the semiconductor component has a hole conductor layer having a specific conductivity of at least $2.5 \times 10^{-5}$ S/m, while the dopant concentration is not more than 20% by volume. In contrast to dopant classes known to date, the superacid salts have the advantage of achieving high conductivities at low concentrations in the hole conduction matrix.

In a further advantageous configuration, the semiconductor component exhibits a hole conductor layer whose absorption capacity in the wavelength range between 400 nm and 700 nm is essentially not increased by the p-doping with the superacid salt. "Essentially not increased" means that the color impression to the human eye remains unchanged, whether or not a dopant is introduced into the matrix. This has the advantage that the doping does not alter the color impression, especially in the switched-off state of the component. The color impression is of significance especially for organic light-emitting diodes. Therefore, the doping is especially preferable for use in organic light-emitting diodes.

More particularly, the superacid salt is a metal salt of a superacid. In other words, the superacid anion binds to a metal cation or metal complex cation. This has the advantage that metal cations or metal complex cations can be introduced into the hole conduction matrix as dopants via such a superacid salt. The predominant portion of the representatives of the class of the superacid salts is suitable for both deposition variants, from the gas phase and from the liquid phase. Accordingly, a superacid salt can be used to introduce metal cations and metal complex cations into the hole conductor matrix in a very simple manner.

Particularly advantageous metal cations have been found to be cations of transition metals, and among these particularly silver and copper. Of the suitable superacids according to the understanding, trifluoromethylsulfonic acid has been found to be particularly suitable. The metal salts of trifluoromethylsulfonic acid are called triflates and are particularly suitable representatives of the dopant classes of the superacid salts. Examples to which particular emphasis should be given for superacid salts from the group of the triflates are silver(I) trifluoromethanesulfonate and copper(II) trifluoromethanesulfonate. Silver(I) trifluoromethanesulfonate has the advantage of increasing the conductivity to up to more than $7 \times 10^{-5}$ S/m, at a dopant concentration of 10% or less. This corresponds to an increase in the current density at component voltage 1 V and layer thickness 200 nm by six orders of magnitude. The particular advantage of silver(I) trifluoromethanesulfonate lies in the low absorption in the visible wavelength range, the effect of which is that the hole conductor layer thus doped appears to be of neutral color to the human eye. A particular feature of copper(II) trifluoromethanesulfonate as a p-dopant is that it can increase the conductivity of the hole conductor layer to up to more than $5 \times 10^{-2}$ S/m at a concentration of 10%.

In the production process for a semiconductor component, the organic hole conductor layer is deposited with a superacid salt in one step. More particularly, this involves depositing the matrix material together with the superacid salt in a combined step.

In an advantageous configuration, in the production process, the matrix material and the superacid salt are deposited from the gas phase, more particularly by thermal vaporization.

In an alternative configuration, in the production process, the matrix material and the superacid salt are deposited from solution.

In the deposition of the hole conductor layer from the gas phase, more particularly, the dopant concentration of the hole conductor layer is adjusted via the vaporization rate of the superacid salt and of the matrix material. Both materials are applied to a substrate, for example, in a covaporization. The volume concentration of the p-dopant in the matrix material, which is adjusted via the vaporization rate, can differ from the actual volume concentration in the fully deposited hole conductor layer.

In the course of deposition of the hole conductor layer from solution, more particularly, the dopant concentration is adjusted via the proportion by mass of the superacid salt and the proportion by mass of the matrix material in the solution prior to the deposition. The volume concentration of the p-dopant in the fully deposited hole conductor layer may differ from this concentration.

Both deposition methods are possible with the material class of the superacid salts. Thus, adaptation of the method to the production operation for the overall organic semiconductor component is enabled. The p-doping with superacid salts thus has the advantage of being able to adapt the dopant very efficiently to the matrix material via the choice of cation and acid anion.

Particularly the optical properties for the use of the p-dopant in organic light-emitting diodes can be greatly improved by this new material class for p-doping. A high conductivity is achieved even at low dopant concentrations. In the field of organic displays or illumination devices, a compromise can be achieved between optical and electrical properties through the p-doping. This is because, as well as the doping effect, the visual appearance of the doped layers are also of significance for the quality of an organic semiconductor component, particularly for display applications or illumination purposes.

Nonlimiting examples of superacids in the context of the term defined above are:

Inorganic:
fluorosulfonic acid ($HSO_3F$)
fluoroantimonic acid ($HSbF_6$)
tetrafluoroboric acid ($HBF_4$)
hexafluorophosphoric acid ($HPF_6$)
trifluoromethylsulfonic acid ($HSO_3CF_3$)

Organic:
pentacyanocyclopentadiene ($HC_5(CN)_5$)
partly or fully fluorinated derivatives of pentaphenylcyclopentadiene
penta(trifluoromethyl)pentadiene or analogous derivatives
partly or fully fluorinated derivatives of tetraphenylboric acid or cyanoderivatives thereof
partly or fully fluorinated derivatives of arylsulfonic acids or cyanoderivatives thereof
partly or fully fluorinated derivatives of arylphosphonic acids or cyanoderivatives thereof
anions of the carboranes, for example $(C_2B_{10}H_{10})^{2-}$ or $(C_1B_{11}H_{10})^{-}$.

Among these, trifluoromethylsulfonic acid ($HSO_3CF_3$) is a particularly suitable representative.

The metal salts of superacids can be obtained with many cations, these being, for example, but without restriction:

cations of the alkali metals cations of the alkaline earth metals cations of lanthanoids (rare earths: La, Ce, Pr, Nd, Sm, Eu, Gd, Tb, Dy, Ho, Er, Tm, Yb, Lu, Y)

cations of the transition metals aluminum cations cationic metal complexes

As well as the conventional salts of the alkali metals and alkaline earth metals, the salts of the rare earths and of scandium and aluminum are of significance in organic synthesis. Particularly suitable salts have been found experimentally to be the triflates, i.e. the salts, especially metal salts, of the superacid trifluoromethanesulfonic acid (TFMS). These have the following general form:

In this formula, M is a metal, $L_n$ is one (n=1) or more (n=2,3,4, . . . ) ligands and x is the charge of the metal complex. Suitable cations are thus especially all cations of complex nature or cations without additional ligands.

However, the cations listed are also suitable for forming salts with anions of other superacids, and these can be used as a p-dopant. Very particular preference is given to the triflates of the transition metals, especially of silver and of copper.

Among these, particularly suitable salts have been found to be:

Copper(II) trifluoromethanesulfonate (Cu(II)TFMS, CAS No. 34946-82-2, vaporization temperature: 350° C.-370° C.@$10^{-5}$ mbar-$10^{-6}$ mbar)

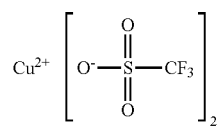

Silver(I) trifluoromethanesulfonate (Ag(I)TFMS, CAS No. 2923-28-6, vaporization temperature: 370° C.-380° C.@$10^{-5}$ mbar-$10^{-6}$ mbar)

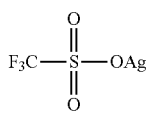

Surprisingly, many of the superacid salts thus formed are volatile and can especially form a doped hole conductor layer together with a hole conductor in the context of a co-condensation reaction. The superacid salts are also very stable, particularly in anhydrous form, and can even be heated well above 400° C.

Copper(I) trifluoromethanesulfonate is suitable exclusively for solution processing, since it cannot be vaporized without decomposition. For this purpose, copper(I) trifluoromethanesulfonate can be processed, for example, in a solvate with benzene ($C_6H_6$), toluene ($C_7H_8$) or acetonitrile ($C_2H_3N$):

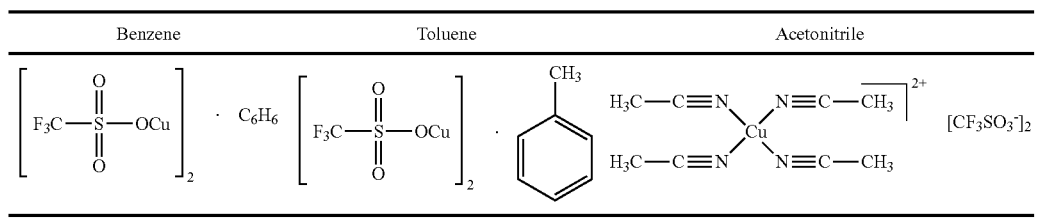

A significant advantage lies in the cost saving. The use of salts of superacids as p-dopants for hole conductor layers of OLEDs, as well as the high doping capacity, simultaneously holds the advantage of extremely low costs. The costs of the p-dopants currently used are 2000 to 7000 €/g, according to the order volume. Ag(I)$CF_3SO_3$ and Cu(II)$[CF_3SO_3]_2$, in contrast, are available at less than 10 €/g from standard fine chemical suppliers. Furthermore, many representatives of this class are commercially available, or at least the preparation processes therefore are known, well-developed and inexpensive.

Organic hole conductors are generally, but not exclusively, derivatives of triarylamines.

In this context, useful hole transporters which can be deposited from the gas phase are especially, but without restriction:

N,N'-bis(naphthalen-1-yl)-N,N'-bis(phenyl)-9,9-dimethylfluorene
N,N'-bis(3-methylphenyl)-N,N'-bis(phenyl)-9,9-diphenylfluorene
N,N'-bis(naphthalen-1-yl)-N,N'-bis(phenyl)-9,9-diphenylfluorene
N,N'-bis(naphthalen-1-yl)-N,N'-bis(phenyl)-2,2-dimethylbenzidine
N,N'-bis(3-methylphenyl)-N,N'-bis(phenyl)-9,9-spirobifluorene
2,2', 7,7'-tetrakis(N,N-diphenylamino)-9,9'-spirobifluorene
N,N'-bis(naphthalen-1-yl)-N,N'-bis(phenyObenzidine
N,N'-bis(naphthalen-2-yl)-N,N'-bis(phenyl)benzidine
N,N'-bis(3-methylphenyl)-N,N'-bis(phenyl)benzidine
N,N'-bis(3-methylphenyl)-N,N'-bis(phenyl)-9,9-dimethylfluorene
N,N'-bis(naphthalen-1-yl)-N,N'-bis(phenyl)-9,9-spirobifluorene
di[4-(N,N-ditolylamino)phenyl]cyclohexane
2,2', 7,7'-tetra(N,N-ditolyl)aminospirobifluorene
9,9-bis[4-(N,N-bis(biphenyl-4-yl)amino)phenyl]-9H-fluorene
2,2', 7,7'-tetrakis[N-naphthalenyl(phenyl)amino]-9,9-spirobifluorene
2,7-bis[N,N-bis(9,9-spirobifluorene-2-yl)amino]-9,9-spirobifluorene
2,2-bis[N,N-bis(biphenyl-4-yl)amino]-9,9-spirobifluorene
N,N'-bis(phenanthren-9-yl)-N,N'-bis(phenyl)benzidine
N,N,N',N'-tetranaphthalen-2-ylbenzidine
2,2'-bis(N,N-diphenylamino)-9,9-spirobifluorene
9,9-bis[4-(N,N-bis(naphthalen-2-yl)amino)phenyl]-9H-fluorene
9,9-bis[4-(N,N'-bis(naphthalen-2-yl)-N,N'-bisphenylamino-phenyl]-9H-fluorene
titanium oxide phthalocyanine
copper phthalocyanine
2,3,5,6-tetrafluoro-7,7,8,8-tetracyanoquinodimethane
4,4',4''-tris(N-3-methylphenyl-N-phenylamino)triphenylamine
4,4',4''-tris(N-(2-naphthyl)-N-phenylamino)triphenylamine
4,4',4''-tris(N-(1-naphthyl)-N-phenylamino)triphenylamine
4,4',4''-tris(N,N-diphenylamino)triphenylamine
pyrazino[2,3-f][1,10]phenanthroline-2,3-dicarbonitrile
N,N,N',N'-tetrakis(4-methoxyphenyl)benzidine
2,7-bis[N,N-bis(4-methoxyphenyl)amino]-9,9-spirobifluorene
2,2'-bis[N,N-bis(4-methoxyphenyl)amino]-9,9-spirobifluorene
N,N'-di(naphthalen-2-yl)-N,N'-diphenylbenzene-1,4-diamine
N,N'-diphenyl-N,N'-di[4-(N,N-ditolyl-amino)phenyl]-benzidine N,N'-diphenyl-N,N'-di[4-(N,N-diphenylamino)phenyl]-benzidine NPB (N,N'-di[(1-naphthyl)-N, N'-diphenyl]-1,1'-biphenyl)-4,4'-diamine These monomolecular hole transport materials can also be deposited from the liquid phase or mixed into the polymeric materials mentioned below in solution. If low molecular weight and polymeric materials are mixed, the film formation properties can be influenced and improved via the mixing ratio (between 0 and 100%).

Polymer hole transporters, which are deposited principally from the liquid phase, are especially, but without restriction:

PEDOT (poly(3,4 ethylenedioxy-thiophene))

PEDOT = Poly(3,4-ethylenedioxythiophene)
CAS: 126213-51-2

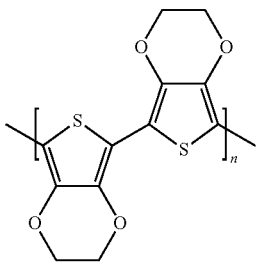

PVK (poly(9-vinylcarbazole))

PVK = Poly(9-vinylcarbazole)
CAS: 25067-59-8

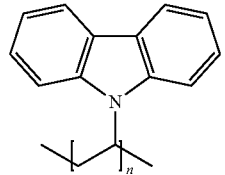

PTPD (poly(N,N'-bis(4-butylphenyl)-N,N'-bis(phenyl)-benzidine)

PTPD = Poly(N,N'-bis(4-butylphenyl)-N,N'-bis(phenyl)benzidine)

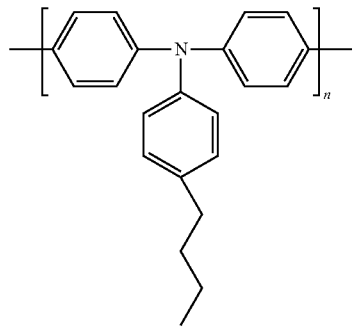

P3HT (poly(3-hexylthiophene))

P3HT = Poly(3-hexylthiophene)
CAS: 104934-50-1

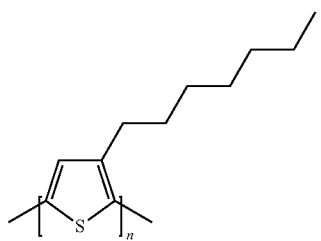

PANI (polyaniline)

PANI = Polyaniline
CAS: 25233-30-1

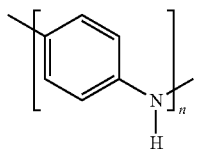

Also within the context are mixtures of the polymeric hole transport materials mentioned.

The solvents used preferably include organic solvents, for example:
benzene,
chlorobenzene,
chloroform,
toluene,
THF,
methoxypropyl acetate,
anisole,
acetonitrile,
phenetole or
dioxane.

A further particular advantage is that the material class of the superacid salts which is suitable for the p-doping can be deposited with the hole conductor matrix from the same solvent. This constitutes a significant simplification of the deposition processes for the component production.

Aside from the particular suitability of the substance class of the superacid salts according to the definition for the deposition of doped hole conductor layers from the gas phase and from the liquid phase, these have the further particular advantage that the appearance of an OLED in the switched-off state is adjustable according to metal cation and concentration via the doping.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
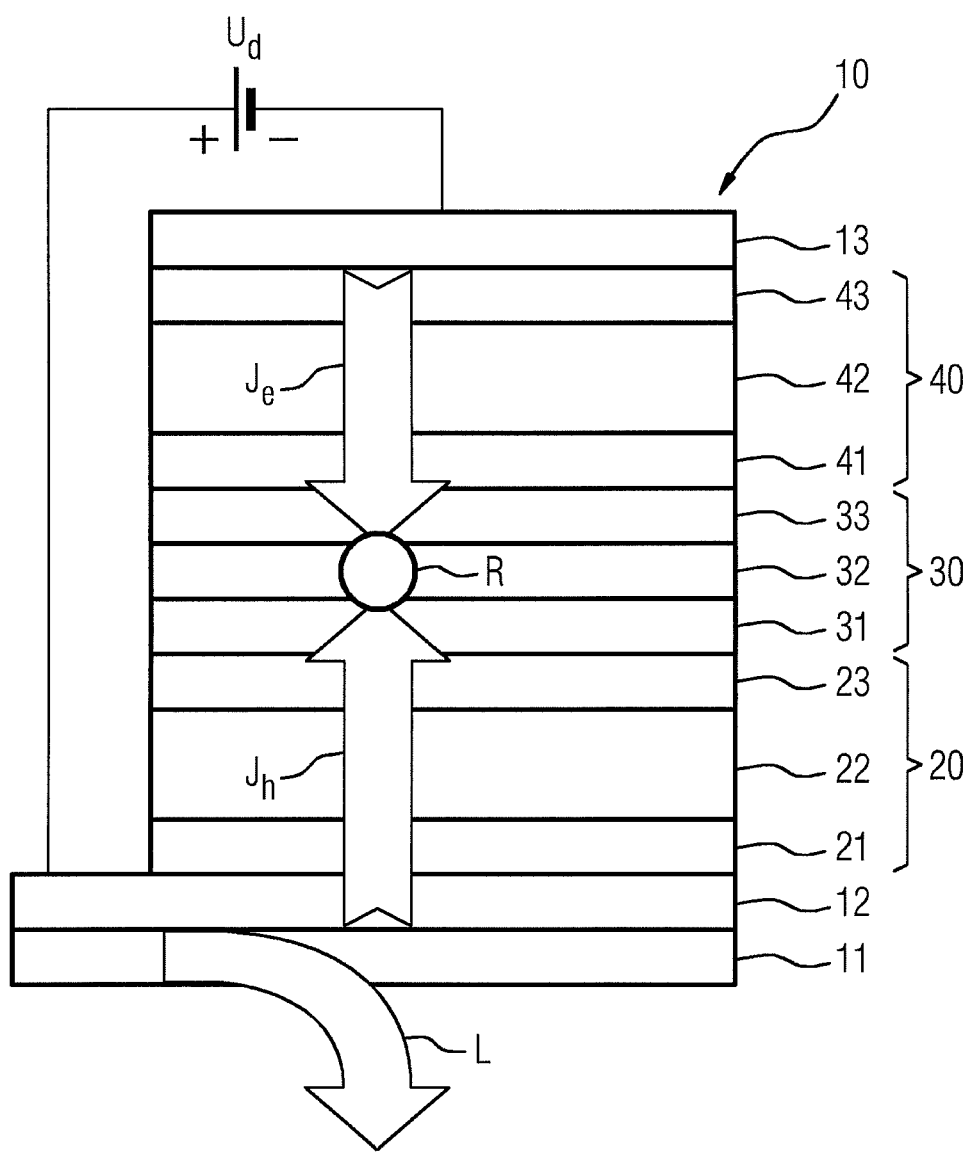
FIG. 1 schematic structure of an organic light-emitting diode.
Figure 2A:
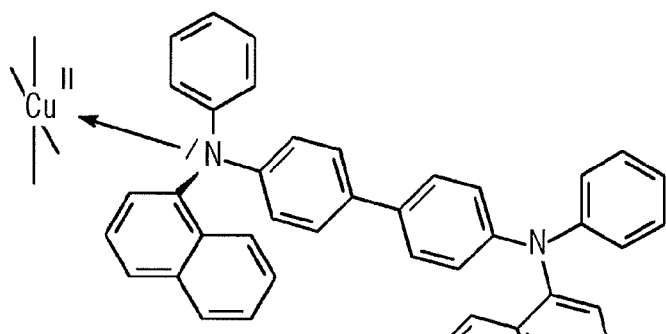
FIG. 2 coordination of NPB in the axial positions of the Cu(II) complex.
Figure 2B:
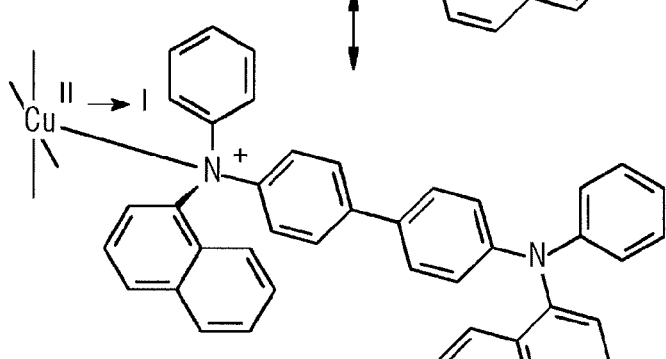
Figure 2C:
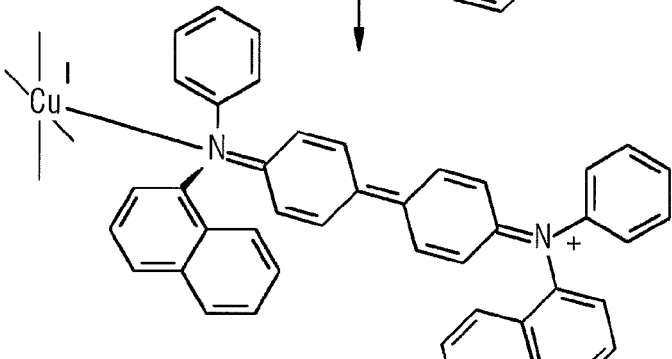
Figure 2D:
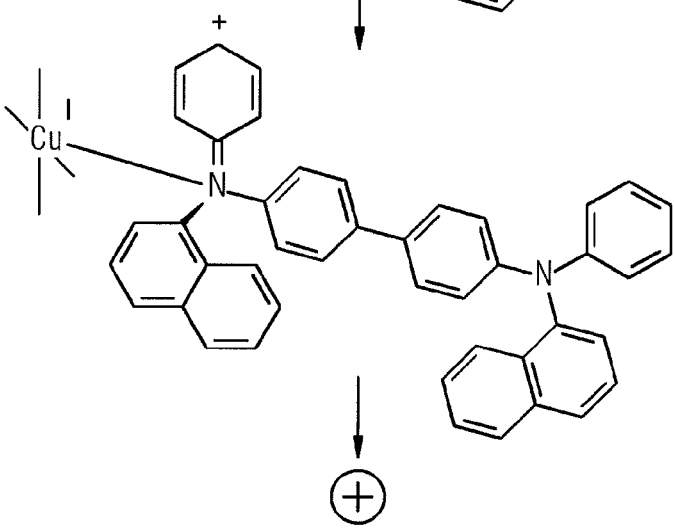

Reference will now be made in detail to the preferred embodiments of the present invention, examples of which are illustrated in the accompanying drawings, wherein like reference numerals refer to like elements throughout.

FIG. 1 shows a schematic of the structure of an organic semiconductor component. This structure is used especially for organic light-emitting diodes. This involves depositing a lower electrode 12 and an upper electrode 13 on a glass substrate 11, with a multitude of organic semiconductor layers 20, 30, 40 in between.

FIG. 1 shows a cross section through the layers arranged horizontally.

The component voltage $U_d$ can be applied to the lower 12 and upper 13 electrodes. In the case shown, the upper electrode 13 is the cathode of the light-emitting diode and the lower electrode 12 the anode of the light-emitting diode. The light is emitted L through the glass substrate 11. For this purpose, the anode 12 is transparent, and is especially made of indium tin oxide (ITO). The anode 12 is adjoined firstly by the hole conduction layers 20. These may be configured so as to emphasize different functions. For example, the first layer 21 on the anode is a hole injection layer, the adjoining hole conductor layer 22 is a hole transport layer and the further adjoining third hole conductor layer 23 functions as an electron-blocking layer, in order to prevent the electrons which come from the cathode side from penetrating into the hole conduction region 20.

Adjoining from the opposite side, the cathode side, is the electronic transport region 40. This may likewise comprise several electron conduction layers. For example, a first electron conduction layer 43 which adjoins the cathode 13 acts as an electron injection layer. Adjoining this, a second electron transport layer 42 is shown, and a third electron transport layer 41 can in turn be used as a hole-blocking layer.

Between the electron transport region 40 and the hole transport region 20 is the emission region 30. This may in turn include several layers. For example, the emission region 30 has three emission layers of different color: a red emission layer 31 adjoins the hole transport region 20, followed by a green emission layer 32, and a blue emission layer 33 adjoins the electron transport region 40.

For the stacking of such OLEDs, the layer may also be built into a charge generation layer.

In a formal sense, the doping can be undertaken by coordination of one to two hole conductor molecules, for example NPB, in the axial positions of the Cu(II) complex, as shown schematically in FIG. 2.

FIG. 2 shows a schematic of the various representations of the mesomeric limiting structures of the complex: in state A, the dopant, in this example a Cu(II) complex, is brought close to a molecule of the hole conduction matrix, in this case an NPB molecule. In state B, there is a purely formal charge transfer in the form of an electron from the NPB molecule to the Cu(II) complex, i.e. a formal/partial charge transfer of a positive charge to the NPB molecule. In that case, the copper atom is only monovalent. In state C, it is shown that the positive charge, also referred to as a hole, can move across the NPS molecule and, in state D, can also be transferred to a second adjacent NPB molecule, which ultimately corresponds to hopping transport in organic semiconductors.

This coordination can be so strong that even materials which are preferentially electron-conductive in the non-coordinated state experience reversal of polarity and become hole conductors.

In one example, commercially available copper(II) trifluoromethanesulfonate (Cu(II)TFMS) can be purified by zone sublimation at a base pressure of $2 \cdot 10^{-6}$ mbar. For this purpose, the material can especially be sublimed twice, which removes residues and impurities present. For this purpose, sublimation steps can be undertaken at different temperature.

For the samples shown in the diagrams in FIGS. 3 to 7, the first sublimation of the Cu(II)TFMS was effected at 350° C.-370° C. and resulted in a yield of 79%. The second sublimation was performed at 330° C.-345° C. and gave a yield of 89%. The overall yield of this purification was thus a good 70%.

This material was used to deposit, on an ITO electrode (indium-doped tin oxide), by thermal vaporization, a 200 nm-thick doped hole conductor layer comprising the hole conductor matrix material HTM-014. The hole conductor is referred to hereinafter as HTM-014. This may represent, for example, bis-N,N,N',N'-(naphthylphenyl)benzidine. As the counterelectrode, a 150 nm-thick aluminum layer was deposited.

Figure 3:
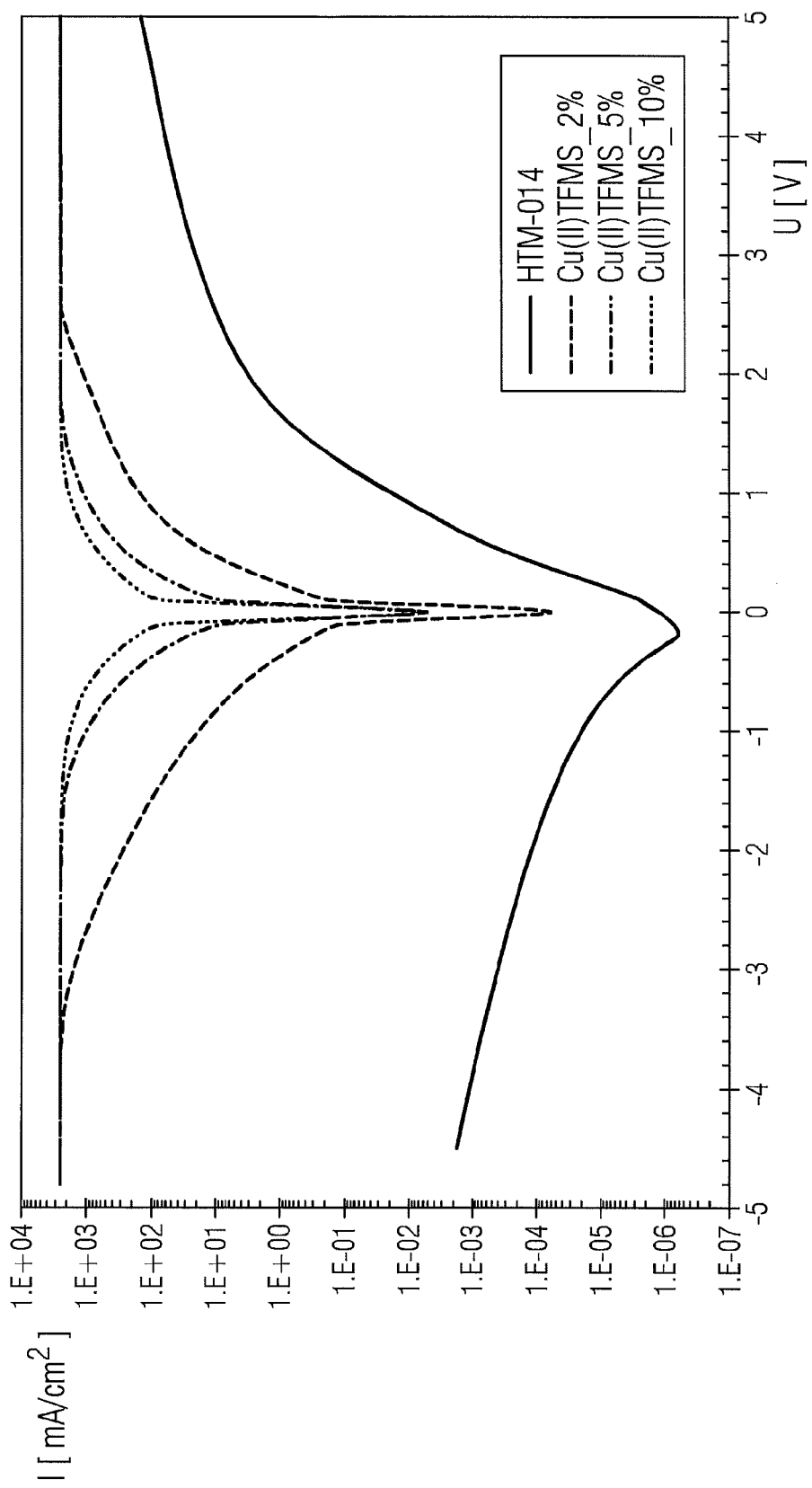
FIG. 3 IV characteristics of HTM-014 and HTM-014 doped with Cu(II)TFMS.

FIG. 3 shows a current-voltage diagram of this organic semiconductor component composed of a hole conduction layer having the Cu(II)TFMS p-doping in different concentrations of 2%, 5% and 10%. This component has a base area of 4 mm$^2$. A reference measurement of the current-voltage characteristic of the undoped hole conductor, designated in the diagram as "HTM-014", illustrates the strong doping effect of Cu(II)TFMS.

For all concentrations, it is accordingly possible to show that the doping has an effect on the current-voltage characteristic. For all concentrations, a distinct rise in the current densities is found compared to the undoped reference component composed of pure HTM-014.

The doping effect is especially dependent on the dopant concentration, which is also shown by the example of Cu(II)TFMS in FIG. 3. The current density rises with rising concentration. In this case, the horizontal regions of the characteristics do not represent a current restriction for the component, but a measurement limit for the measurement setup. The smaller the voltage $U_d$ at which the maximum measurable current density has been measured in the component, the better the doping effect.

The symmetric behavior of the current-voltage characteristic for positive and negative operating voltages $U_d$, at least at concentrations of 5% and 10%, shows that the hole injection is independent of the work function of the electrodes and therefore functions equally well for the aluminum electrode and the ITO electrode. The 2% sample does not show fully symmetric behavior since the matrix material is a hole transporter. The dopant concentration of 2% is not yet sufficient to achieve injection comparable to the ITO electrode from the aluminum electrode.

Figure 4:
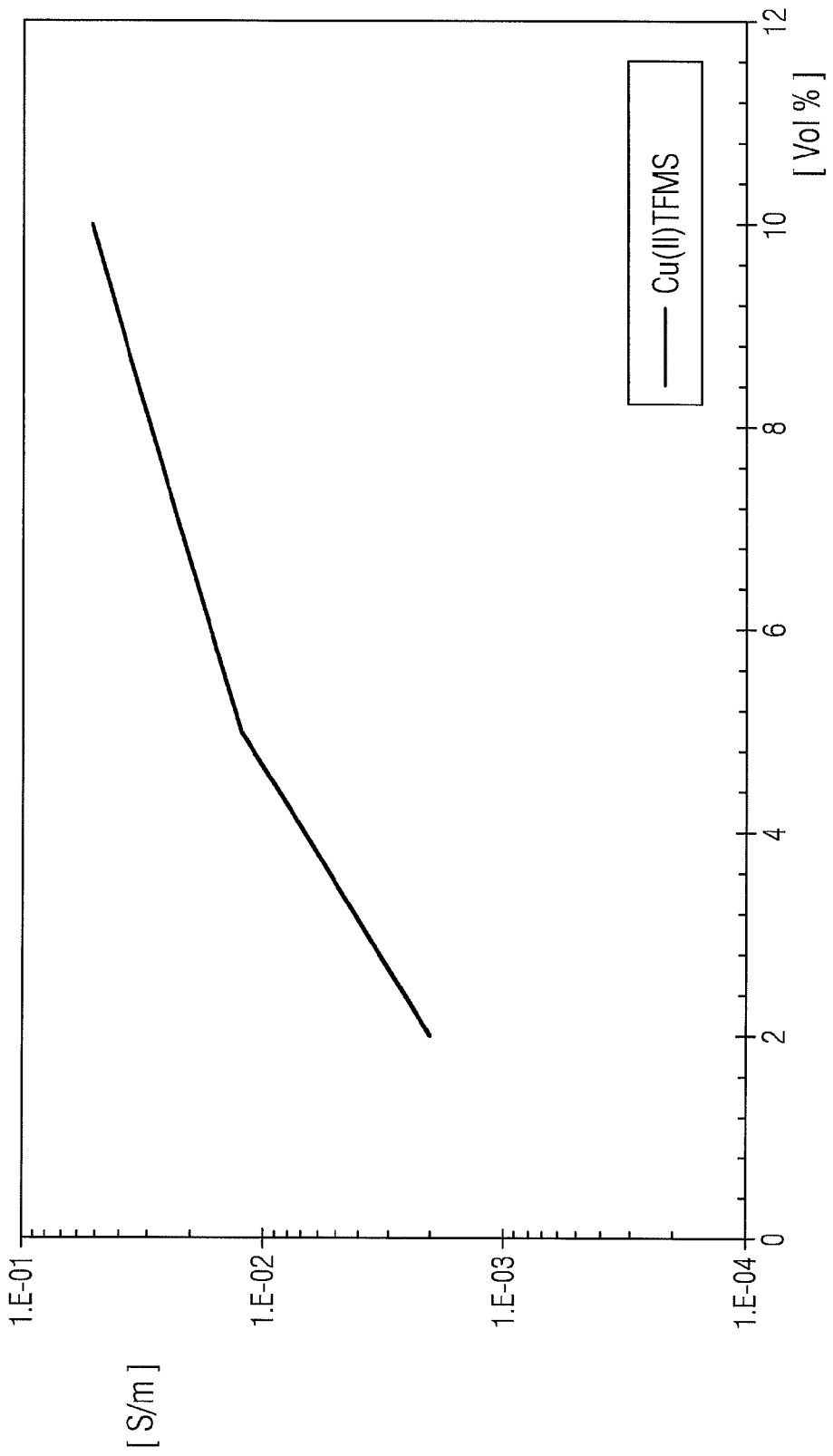
FIG. 4 conductivities against the dopant concentration for HTM-014 doped with Cu(II)TFMS, FIG. 5 absorption spectra of HTM-014 and HTM-014 doped with Cu(II)TFMS, FIG. 6 PL spectra of HTM-014 and HTM-014 doped with Cu(II)TFMS, FIG. 7 reflection spectra of HTM-014 doped with Cu(II) TFMS, FIG. 8 IV characteristics of HTM-014 and HTM-014 doped with Ag(I)TFMS, FIG. 9 conductivities against the dopant concentration for HTM-014 doped with Ag(I)TFMS, FIG. 10 absorption spectra of HTM-014 and HTM-014 doped with Ag(I)TFMS, FIG. 11 PL spectra of HTM-014 and HTM-014 doped with Ag(I)TFMS, FIG. 12 reflection spectra of HTM-014 doped with Ag(I) TFMS.

FIG. 4 shows a diagram in which the conductivity of the doped hole transport layer in siemens/m is plotted as a function of the concentration of the p-dopant in the hole conductor layer. For this purpose, at the same time as the samples for the measurement of the current-voltage characteristics, substrates on which the conductivity of the doped layers can be measured were coated. For this purpose, components of various dimensions were produced in order to rule out the possibility, for the determination of the conductivity, that the measured effects depend on thickness and area of the components. This gives the following specific values for the selected dopant concentrations:

| 2% | Cu(II)TFMS in HTM-014: | $1.99 \cdot 10^{-3}$ S/m |
| 5% | Cu(II)TFMS in HTM-014: | $1.24 \cdot 10^{-2}$ S/m |
| 10% | Cu(II)TFMS in HTM-014: | $5.25 \cdot 10^{-2}$ S/m |

The diagram in FIG. 4 shows the conductivities as a function of the dopant concentration. The plot shown confirms the current-voltage characteristics shown in FIG. 3. The conductivity rises with the dopant concentration, as does the current density.

The conductivity can be enhanced via even higher dopant concentrations only up to material-specific limits, since the operation is no longer a doping operation from a certain concentration.

Figure 5:
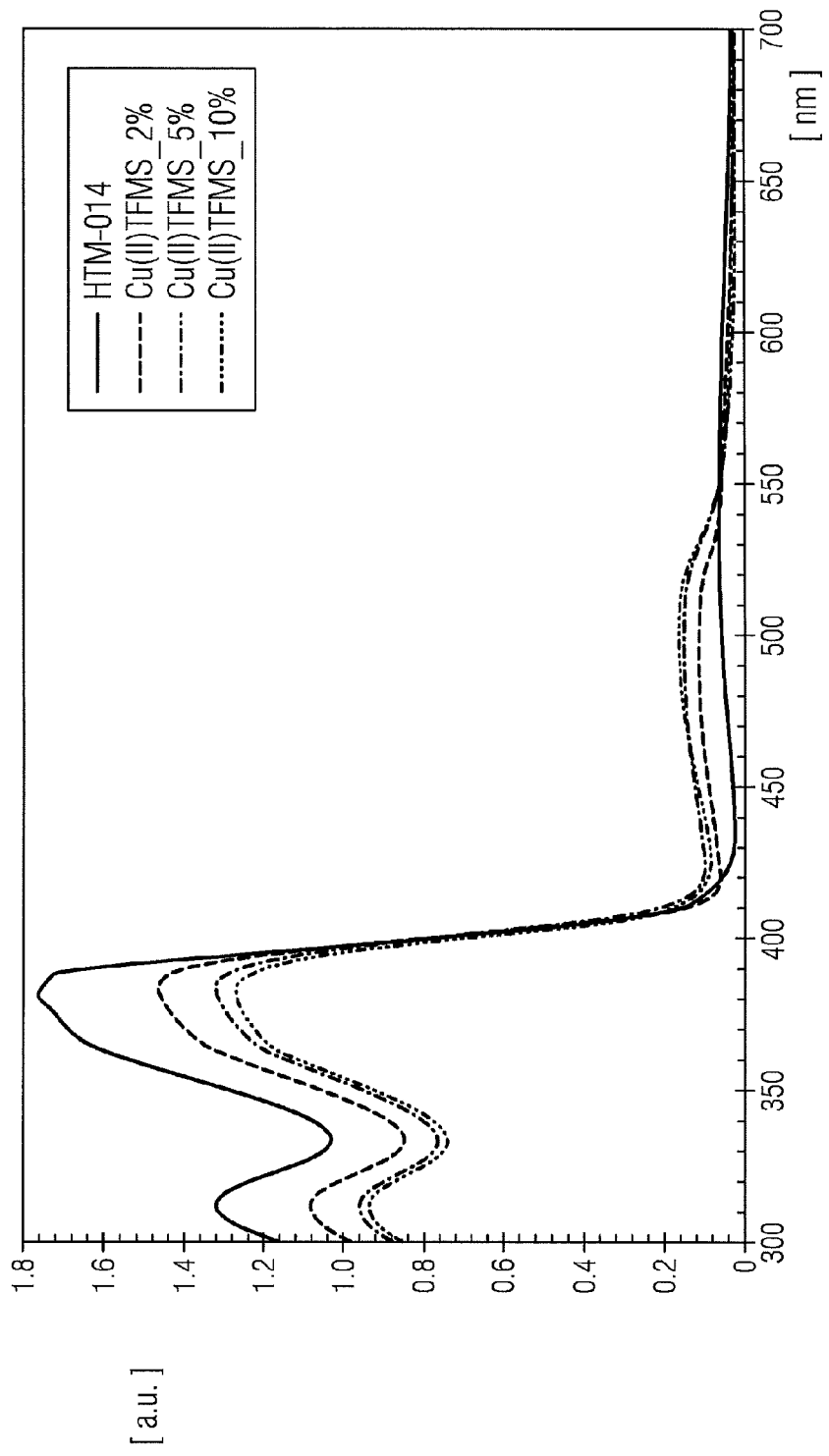
Figure 6:
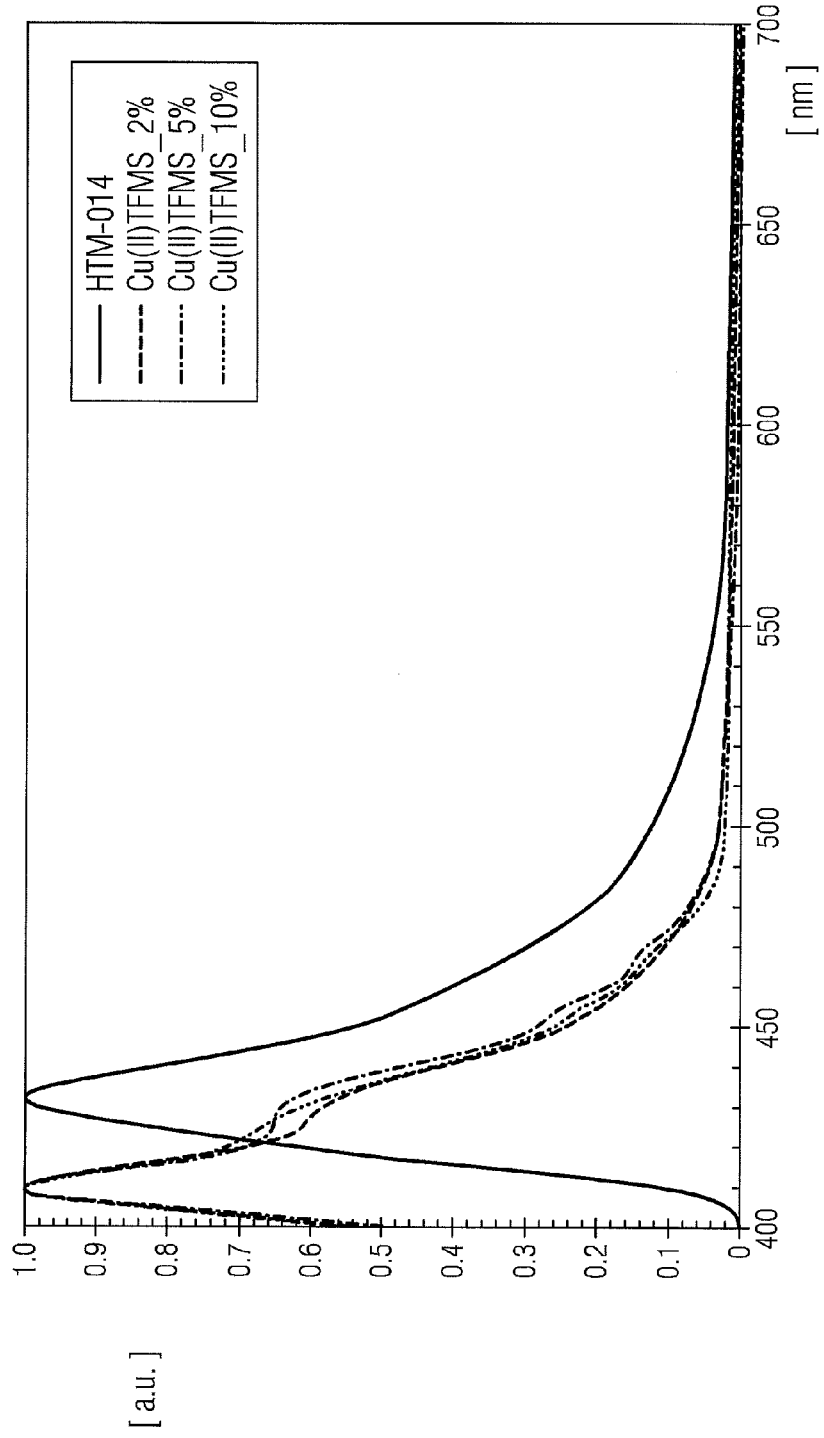
Figure 7:
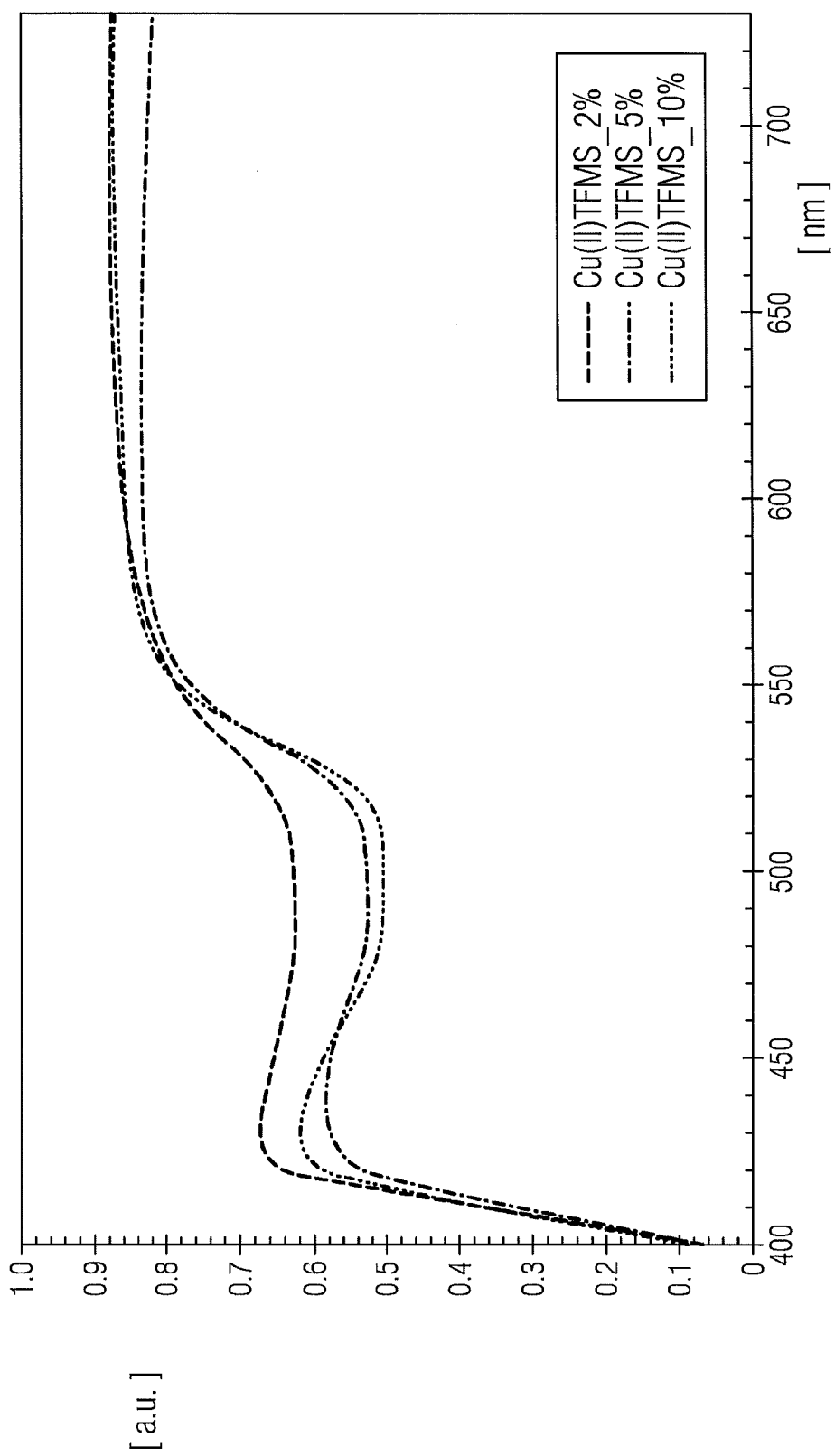

FIGS. 5, 6 and 7 show the absorption, emission and reflection spectra of the Cu(II)TFMS-doped organic hole conductor layers. For this purpose, these were deposited on quartz glass substrates. These substrates do not have any electrode contacts and serve merely for optical measurement.

The absorption spectra in FIG. 5 show that the absolute absorption in the absorption maximum at wavelength 384 nm declines with rising dopant concentration. The absorption of the HTM-014 below 400 nm is thus lowered by the doping, which is because of the formation of a charge transfer complex.

At the same time, there is a rise in the absorption between 410 nm and 550 nm. Within this range too, the absorption rises with rising dopant concentration. For the visible wavelength range from approximately 400 nm to 700 nm, there is thus a rise in the absorption in the blue to the green wavelength range, as a result of which the layers appear reddish to the human eye.

FIG. 6 shows the photoluminescence spectra of the hole conductor layers with the Cu(II)TFMS doping compared to the spectrum of undoped HTM-014. The emission at a wavelength of 432 nm is shifted by the doping to 409 nm. In addition, a distinct shoulder for the doped layers forms at 430 nm. The shift and shoulder formation can be attributed to the formation of a charge transfer complex.

FIG. 7 shows the reflection spectra of the doped hole conductor layers: with rising dopant concentration, the reflection in the blue-green wavelength range falls and is maintained in the red range. Therefore, the layers obtained have a red tinge to the human eye. The dependence of the dopant concentration can also be seen visually: the hue of the coated substrates becomes ever darker and redder to the human eye with rising concentration.

In a further example, commercially available silver(I) trifluoromethanesulfonate (Ag(I)TFMS) was used. For the samples shown in the diagrams of FIGS. 8 to 12, purification of the material was also effected: zone sublimation at a base pressure of $2 \cdot 10^{-6}$ mbar was effected at 370° C.-380° C. and resulted in a yield of 47%. Analogously to the Cu(II)TFMS example, the purified Ag(I)TFMS was introduced into the HTM-014 hole conductor matrix for doping. The substrates, electrodes, layer thicknesses and component size are identical here to those for the Cu(II)TFMS samples.

Figure 8:
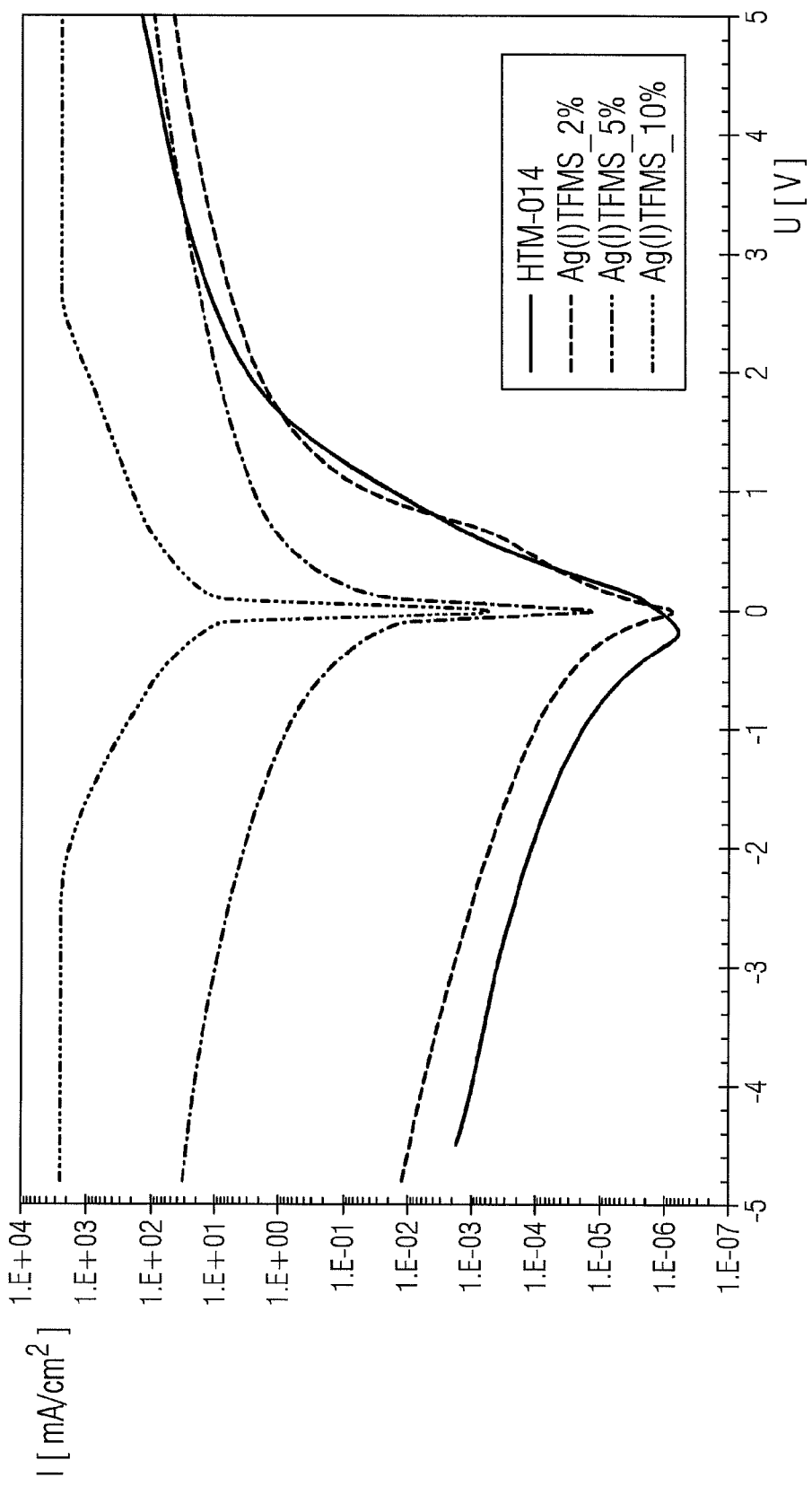

FIG. 8 shows a current-voltage diagram of an organic semiconductor element with a hole conduction layer and p-doping with Ag(I)TFMS in different concentrations. Through the variation of the concentration, it is possible to show that the doping has an effect on the current-voltage characteristic: at dopant concentration 5%, an increase in the current density is observed for negative and for small positive voltages (<2V). The characteristics at concentrations 5% and 10% are nearly symmetrical and clearly show the successful doping and the improved electrical conductivity. The symmetric behavior again shows that the hole injection is independent of the work function of the electrodes. At dopant concentration 10%, the characteristic against reaches the current restriction of the measuring instrument, as already described.

Figure 9:
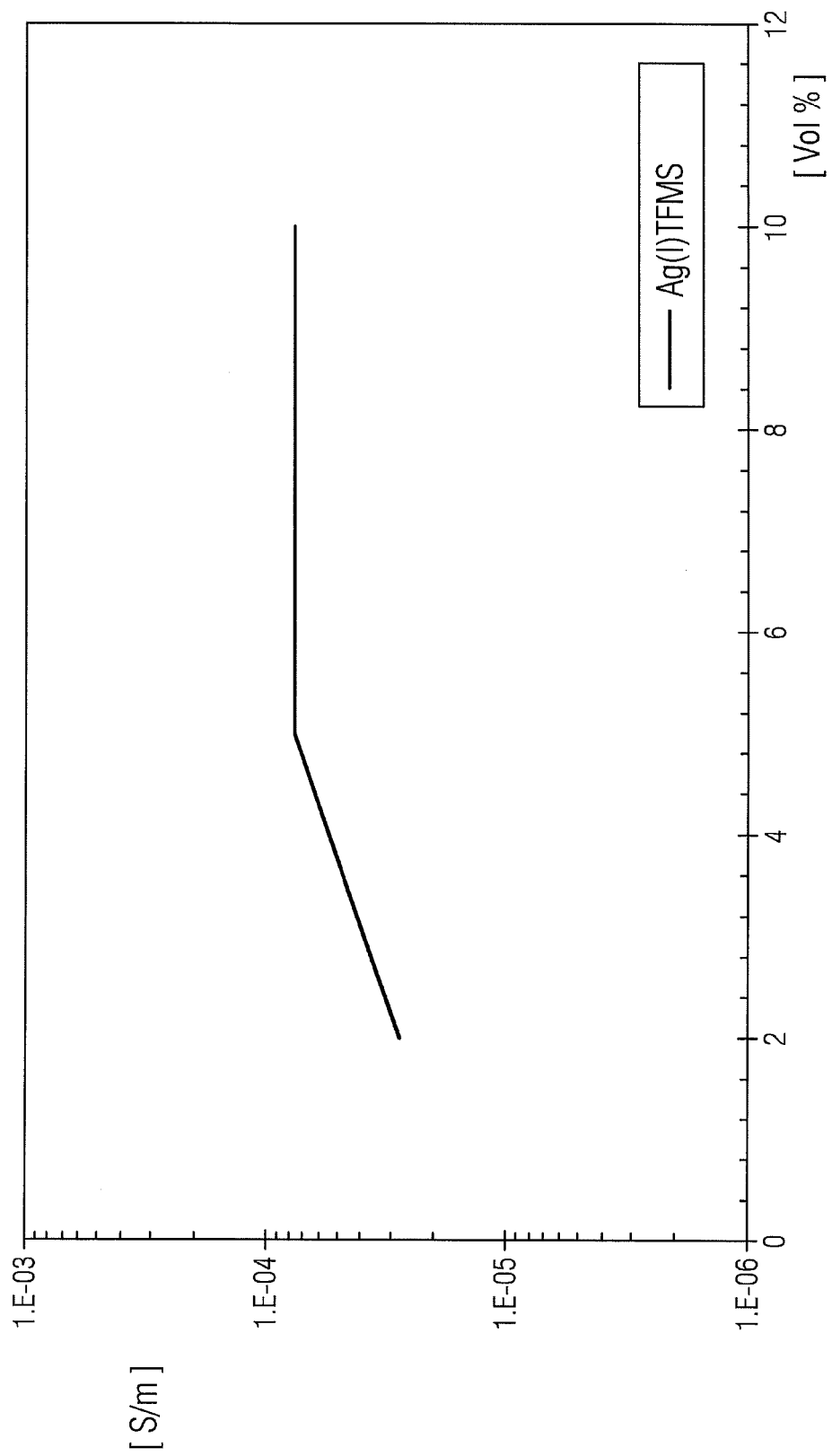

FIG. 9 shows a diagram in which the conductivity of the hole transport layer in siemens/m is plotted as a function of the concentration of the p-dopant in the hole conductor layer. The samples were produced analogously to the Cu(II)TFMS samples. The components with the Ag(I)TFMS-doped hole conduction layers have the following specific conductivities as a function of the dopant concentration:

| 2% | Ag(I)TFMS in HTM-014: | $2.76 \cdot 10^{-5}$ S/m |
|---|---|---|
| 5% | Ag(I)TFMS in HTM-014: | $7.66 \cdot 10^{-5}$ S/m |
| 10% | Ag(I)TFMS in HTM-014: | $7.86 \cdot 10^{-5}$ S/m |

Figure 10:
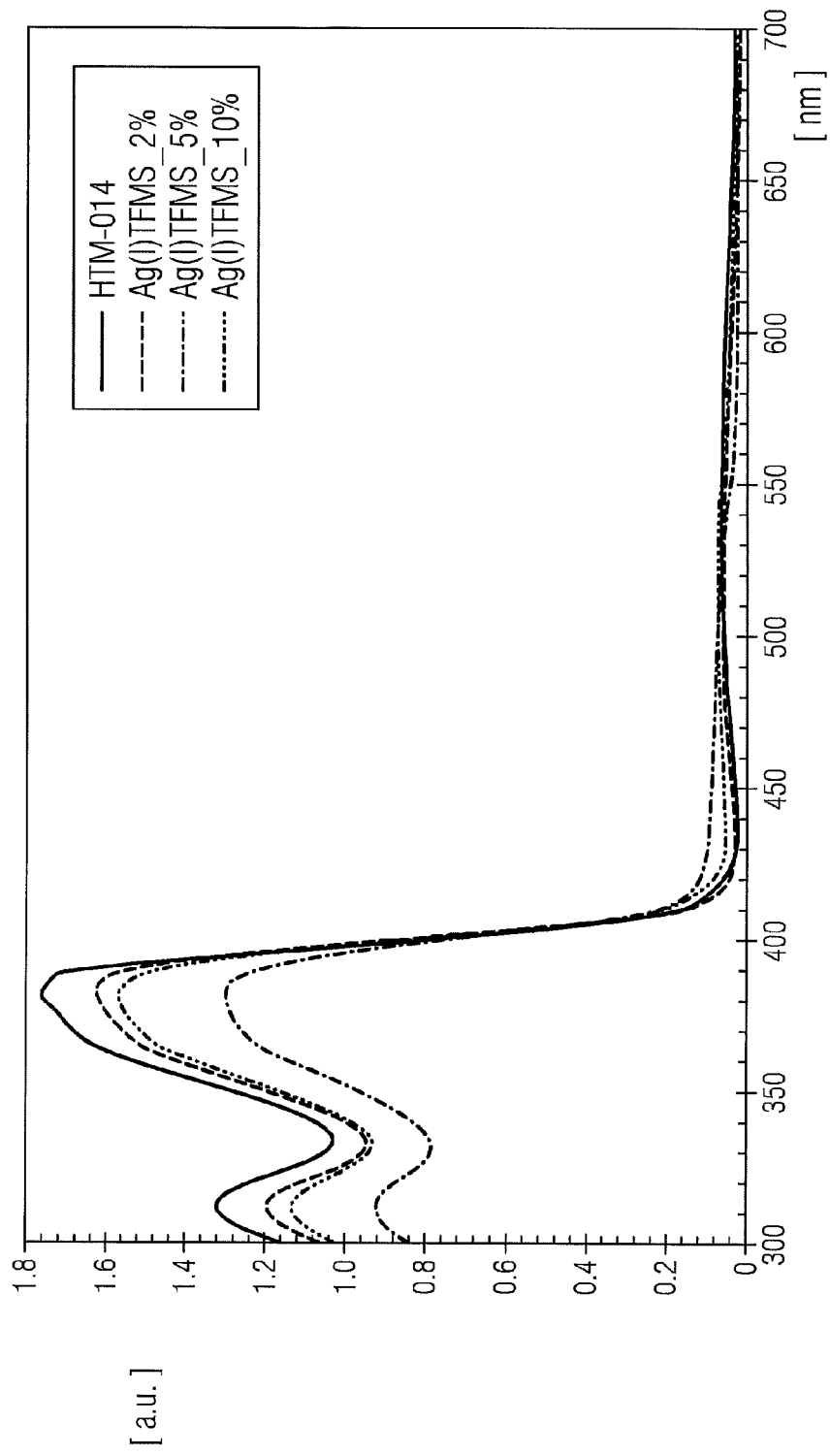
Figure 11:
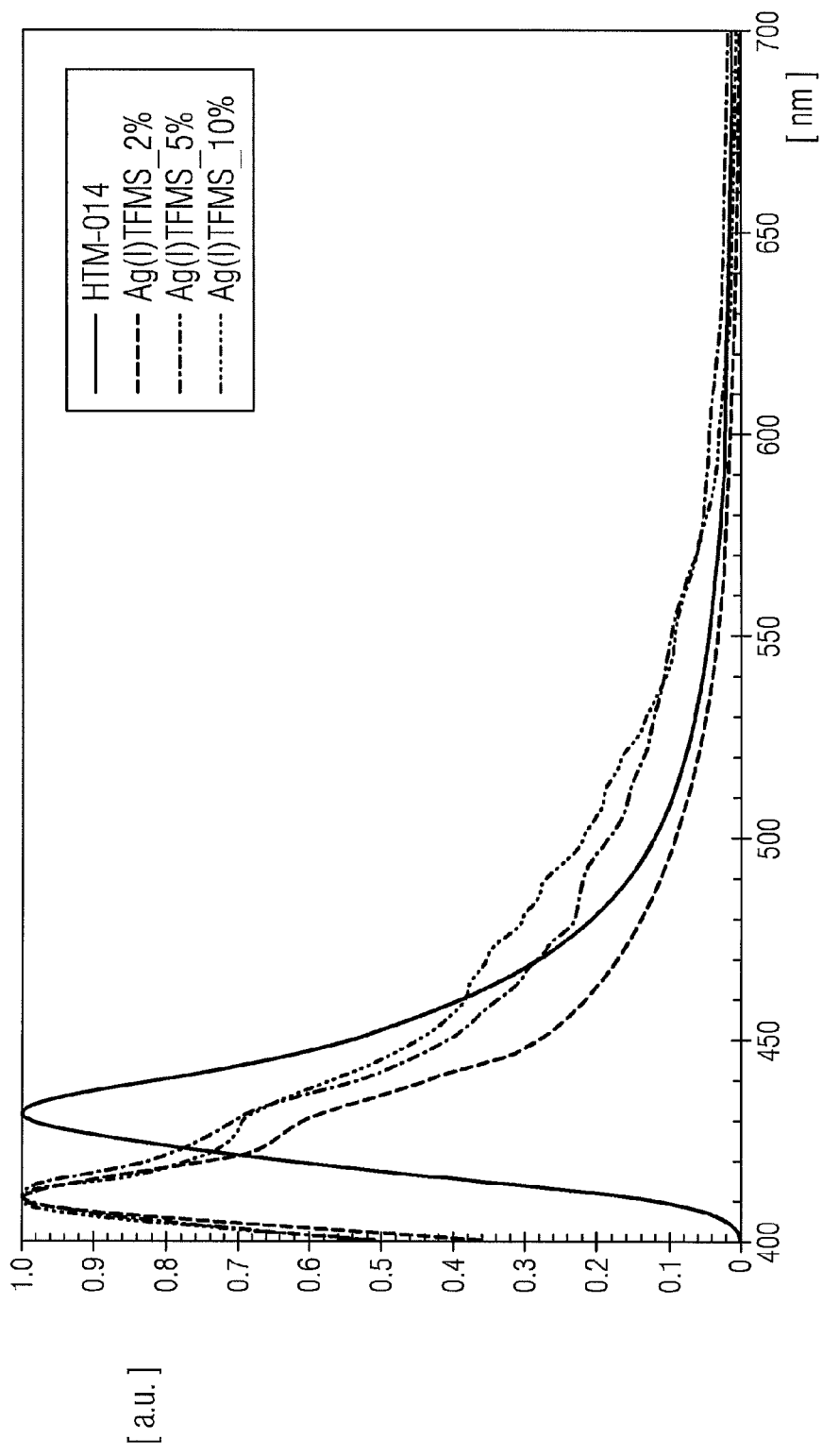
Figure 12:
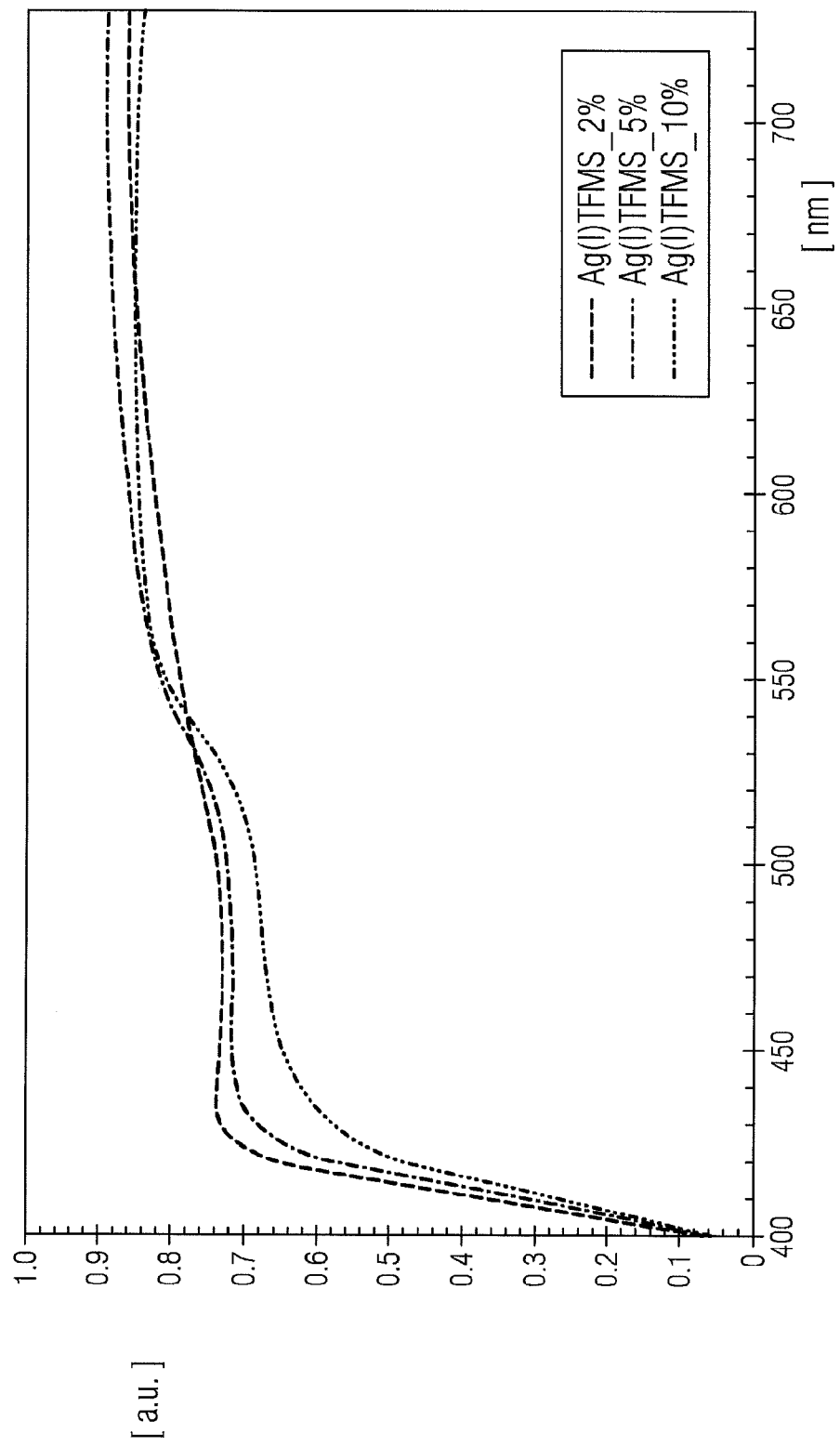

FIGS. 10, 11 and 12 show the absorption, emission and reflection spectra of the Ag(I)TFMS-doped organic hole conductor layers. For this purpose, these were again deposited on quartz glass substrates.

The absorption spectra in FIG. 10 show that the absolute absorption in the absorption maximum at wavelength 384 nm declines with rising dopant concentration. At the same time, there is a rise in the absorption between 410 nm and 550 nm with rising dopant concentration. For the visible wavelength range from approximately 400 nm to 700 nm the absorption rises slightly, but the layers remain neutral in color to the human eye, in contrast to the Cu(II)TFMS samples.

FIG. 11 shows the photoluminescence spectra of the hole conductor layers with Ag(I)TFMS doping. The comparison thereof with the spectrum of undoped HTM-014 shows that the emission at a wavelength of 432 nm, which is customary for HTM-014, is shifted to 410 nm by the doping. In addition, a clear shoulder for the doped layers forms at 430 nm. This shift and shoulder formation is again attributable to the formation of a charge transfer complex.

FIG. 12 shows the reflection spectra of the doped hole conductor layers. With rising dopant concentration, the reflection in the blue-green wavelength range declines very slightly and is maintained in the red wavelength range, depending on the dopant concentration. The layers have a neutral hue to the human eye.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A semiconductor component comprising:
   an organic hole conductor layer having p-doping with a superacid salt, the superacid salt comprising a salt of a superacid, the superacid being an acid having an acid constant value $pK_a$ less than −4.

2. The semiconductor component as claimed in claim 1, wherein the hole conductor layer having p-doping has a specific conductivity of at least $2.5 \cdot 10^{-5}$ S/m at a dopant concentration of not more than 20% by volume.

3. The semiconductor component as claimed in claim 1, wherein
   the organic hole conductor layer having p-doping comprises a given composition and the p-doping,
   an organic hole conductor layer having the given composition but excluding the p-doping has a first absorption capacity in a wavelength range between 400 nm and 700 nm, and
   the hole conductor layer having the p-doping has a second absorption capacity in the wavelength range between 400 nm and 700 nm,
   the second absorption capacity is not substantially increased relative to the first absorption capacity, such that the organic hole conductor layer having the given composition but excluding the p-doping has substantially the same color impression to a human eye as the hole conductor layer having the p-doping.

4. The semiconductor component as claimed in claim 1, wherein the superacid salt is a metal salt of a superacid.

5. The semiconductor component as claimed in claim 1, wherein the superacid salt comprises a triflate, the triflate being a metal salt of trifluoromethanesulfonic acid.

6. The semiconductor component as claimed in claim 5, wherein the metal salt has cations of transition metals.

7. The semiconductor component as claimed in claim 1, wherein the superacid salt comprises silver(I) trifluoromethanesulfonate (Ag(I)TFMS).

8. The semiconductor component as claimed in claim 1, wherein the superacid salt comprises copper(II) trifluoromethanesulfonate (Cu(II)TFMS).

9. A production process for a semiconductor component, comprising:
   depositing an organic hole conductor layer having p-doping with a superacid salt, the superacid salt comprising a salt of a superacid, the superacid being an acid having an acid constant value $pK_a$ less than −4.

10. The production process as claimed in claim 9, wherein the organic hole conductor layer is deposited by depositing a matrix material together with the superacid salt in a combined deposition process.

11. The production process as claimed in claim 10, wherein the matrix material and the superacid salt are deposited from the gas phase, by thermal vaporization.

12. The production process as claimed in claim 11, wherein
   the matrix material and the superacid salt are deposited from the gas phase by covaporization, and
   the production process further comprises adjusting a dopant concentration of the superacid salt in the hole conductor layerby adjusting relative vaporization rates of the superacid salt and the matrix material.

13. The production process as claimed in claim 9, wherein the matrix material and the superacid salt are deposited from solution.

14. The production process as claimed in claim 13, wherein
   the production process further comprises adjusting a dopant concentration of the superacid salt in the hole conductor layerby adjusting a mass proportion of the superacid salt in solution relative to a mass proportion in solution of the matrix material, and
   the dopant concentration is adjusted prior to deposition.

15. An organic light-emitting diode comprising:
   a transparent substrate;
   a lower electrode formed on the substrate;
   a layer stack formed on the lower electrode, the layer stack comprising:
      an organic hole transport layer having p-doping with a superacid salt, the superacid salt comprising a salt of a superacid, the superacid being an acid having an acid constant value $PK_a$ less than −4;
      a light emission layer; and
      an electron transport layer; and
   an upper electrode.

* * * * *